United States Patent [19]
Matsubara et al.

[11] Patent Number: 6,127,267
[45] Date of Patent: Oct. 3, 2000

[54] FABRICATION METHOD OF SEMICONDUCTOR DEVICE EQUIPPED WITH SILICIDE LAYER

[75] Inventors: Yoshihisa Matsubara; Takashi Ishigami; Yoshiaki Yamada; Shinichi Watanuki, all of Tokyo, Japan

[73] Assignee: NEC Corporation, Tokyo, Japan

[21] Appl. No.: 09/168,670

[22] Filed: Oct. 9, 1998

[30] Foreign Application Priority Data

Oct. 9, 1997 [JP] Japan ................................. 9-277604

[51] Int. Cl.⁷ ........................ H01L 21/44; H01L 21/4763
[52] U.S. Cl. ...................... 438/656; 438/303; 438/301; 438/664; 438/655; 438/682; 438/651; 438/649; 438/592
[58] Field of Search ..................... 438/656, 655, 438/660, 662–663, 682–683, 648–651, 586, 592–594, 583, 299, 301, 303

[56] References Cited

U.S. PATENT DOCUMENTS

| | | | |
|---|---|---|---|
| 5,326,724 | 7/1994 | Wei | 438/655 |
| 5,451,545 | 9/1995 | Ramaswami et al. | 438/649 |
| 5,593,924 | 1/1997 | Apte et al. | 438/647 |
| 5,902,129 | 5/1999 | Yoshikawa et al. | 438/592 |
| 5,920,122 | 7/1999 | Matsumoto et al. | 257/764 |
| 6,008,111 | 12/1999 | Fushida et al. | 438/564 |
| 6,022,795 | 2/2000 | Chen et al. | 438/586 |

FOREIGN PATENT DOCUMENTS

| | | |
|---|---|---|
| 9-186104 | 7/1997 | Japan . |
| 9-186105 | 7/1997 | Japan . |

*Primary Examiner*—Charles Bowers
*Assistant Examiner*—Thanh Nguyen
*Attorney, Agent, or Firm*—Sughrue, Mion, Zinn, Macpeak & Seas, PLLC

[57] ABSTRACT

A fabrication method of a semiconductor device is provided, which makes it possible to form a thin and elongated refractory-metal silicide layer while preventing the overgrowth phenomenon. This method is comprised of the steps (a) to (c). In the step (a), a first refractory metal film is formed on a silicon region. In the step (b), a second refractory metal film is formed on the first refractory metal film. The second refractory metal film contains a same refractory metal as the first refractory metal film and nitrogen. A stress of the second refractory metal film is controlled to be a specific value or lower. In the step (c), the first refractory metal film and the second refractory metal film are heat-treated in an atmosphere excluding nitrogen, thereby forming a refractory-metal silicide layer at an interface between the silicon region and the first refractory metal film due to silicidation reaction of the first refractory metal film with the silicon region. The value of the stress of the second refractory metal film is set so that the second refractory metal film applies substantially no effect to a plastic deformation of the refractory-metal silicide layer occurring during the silicidation reaction in the step (c).

20 Claims, 13 Drawing Sheets

FABRICATION METHOD OF SEMICONDUCTOR DEVICE EQUIPPED WITH SILICIDE LAYER

BACKGROUND OF THE INVENTION

1. Field of the Invention

The present invention relates to a fabrication method of a semiconductor device and more particularly, to a fabrication method of a semiconductor device equipped with a layer of metal silicide such as titanium silicide, in which the so-called self-aligned silicide (SALICIDE) technique is preferably used.

2. Description of the Prior Art

In recent years, semiconductor devices have been becoming miniaturized more and more and their integration scale has been becoming higher and higher. Under such the circumstances, a lot of electronic devices such as memory or logic devices, which have been designed under the design rule as narrow as 0.15 to 0.25 $\mu$m, have been integrated on a semiconductor chip. In these highly-integrated devices, Metal-Oxide-Semiconductor Field-Effect Transistors (MOSFETs) are typically used.

To cope with the progressing miniaturization and increasing integration tendency, there has been the strong need to decrease the length of gate electrodes and the width of source/drain regions for the MOSFETs. However, the decrease of the length of gate electrodes and the width of source/drain regions increase their electric resistance, thereby delaying the operation speed of the devices.

Accordingly, in the electronic devices thus miniaturized and integrated, it has been popular that silicide layers are additionally formed in the surface regions of the gate electrodes and the source/drain regions to thereby lower their electric resistance. The silicide layers for the MOSFETs are typically formed with the use of the so-called "SALICIDE" technique.

A first example of the conventional fabrication methods of this sort is shown in FIGS. 1A to 1E.

It is needless to say that a lot of MOSFETs are formed and integrated on a semiconductor substrate. However, only one of the MOSFETs is explained in this specification and attached drawings for the sake of simplification.

First, as shown in FIG. 1A, an isolation oxide 1102 is selectively formed on the surface region of a single-crystal silicon (Si) substrate 1101 by a Local Oxidation of Silicon (LOCOS) process, thereby defining a device region 1101A in which a MOSFET is formed. An impurity is selectively ion-implanted into the substrate 1101 to form channel stop regions, thereby raising the dielectric breakdown voltage. A silicon dioxide ($SiO_2$) film 1103 is formed on the whole exposed surface of the substrate 1101 in the device region 1101A by a thermal oxidation process.

Then, a polysilicon film (not shown) with a thickness of approximately 150 nm is deposited on the $SiO_2$ film 1103 over the whole substrate 1101 by a Chemical Vapor Deposition (CVD) process. The polysilicon film thus formed is doped with an impurity such as phosphorus (P) to lower its electric resistance. The polysilicon film having the lowered electric resistance is then patterned to a specific plan shape, thereby forming a gate electrode 1104 on the $SiO_2$ film 1103 in the device region 1101A.

A $SiO_2$ film (not shown) is deposited over the whole substrate 1101 by a CVD process to cover the polysilicon gate electrode 1104, the $SiO_2$ film 1103, and the isolation oxide 1102 made of $SiO_2$. Then, the $SiO_2$ film thus deposited, the $SiO_2$ film 1103, and the isolation oxide 1102 are etched by an anisotropic etching process, thereby forming a pair of sidewall spacers 1105 at each side of the gate electrode 1104. The sidewall spacers 1105 are made of $SiO_2$. During this etching process, the surface of the substrate 1101 is uncovered at the locations for source/drain regions. The remaining $SiO_2$ film 1103 serves as a gate oxide film. The gate electrode 1104 is located on the gate oxide film 1103 thus formed.

Subsequently, an impurity such as arsenic (As) or boron (B) is selectively implanted into the device region 1101A of the substrate 1101 by an ion-implantation process. The substrate 1101 is then subjected to a heat treatment at a temperature of 800 to 1000° C., thereby forming a pair of source/drain regions 1106 at each side of the gate electrode 1104 in the device region 1101A. The pair of source/drain regions 1106 are formed in self alignment to the gate electrode 104 and the pair of sidewall spacers 1105. The state at this stage is shown in FIG. 1A.

Following this step, a titanium (Ti) film 1107 with a thickness of approximately 50 nm is deposited over the whole substrate 1101 by a sputtering process, as shown in FIG. 1B. The substrate 1101 on which the Ti film 1107 has been deposited is then subjected to a first heat-treatment process in a nitrogen ($N_2$) atmosphere kept at the atmospheric pressure at a temperature of 600 to 650° C. for 30 to 60 seconds using a lamp annealing apparatus.

Thus, as shown in FIG. 1C, silicidation reaction occurs near the interfaces of the Ti film 1107 with the single-crystal silicon source/drain regions 1106 and the polysilicon gate electrode 1104, thereby forming titanium silicide ($TiSi_2$) layers 1109, where x is approximately equal to 2. These $TiSi_2$ layers 1109 are in the C-49 phase having a comparatively high electric resistivity of approximately 60 $\mu\Omega$·cm. At the same time as this silicidation reaction, the Ti film 1107 is nitrided to form a titanium nitride ($Ti_xN$) film 1107' due to diffusion of the nitrogen atoms contained in the atmosphere into the Ti film 1107, where x is equal to or greater than unity (i.e., $x \geq 1$).

Subsequently, using a mixture of water solutions of ammonia ($NH_3$) and hydrogen peroxide ($H_2O_2$) as an etchant, the unreacted $Ti_xN$ film 1107' is removed by a wet etching process. As a consequence, the $TiSi_2$ layers 1109 are left on the surface regions of the pair of source/drain regions 1106 and the gate electrode 1104, respectively, as shown in FIG. 1D.

Moreover, the substrate 1101 having the $TiSi_2$ layers 1109 is subjected to a second heat-treatment process in a nitrogen ($N_2$) atmosphere kept at the atmospheric pressure at a temperature of approximately 850° C. for approximately 60 seconds using a lamp annealing apparatus. Thus, the $TiSi_2$ layers 1109 with the C-49 phase are transformed to $TiSi_2$ layers 1111 with the C54-phase having a comparatively low electric resistivity of approximately 20 $\mu\Omega$·cm, as shown in FIG. 1E.

The reason why the above-described first heat-treatment process to form the $TiS_x$ film 1109 with the C-49 phase is carried out in a $N_2$ atmosphere is as follows.

Specifically, in the above-described silicidation reaction of Ti with Si, Si serves as a diffusion species. Therefore, Si atoms are introduced into not only the gate electrode 1104 and the source/drain regions 1106 but also the isolation oxide 1102 due to diffusion during this silicidation reaction process. If these Si atoms diffused into the isolation oxide 1102 react with Ti, a $TiSi_2$ layer is formed on the isolation oxide 1102, thereby degrading the electrical isolation performance of the isolation oxide 1102. The phenomenon that the undesired $TiSi_2$ layer is formed on the isolation oxide 1102 has been termed the "overgrowth". To avoid this "overgrowth" phenomenon, the first heat-treatment process is performed in a $N_2$ atmosphere to cause a reaction of Ti with N, thereby forming the $Ti_xN$ film 1107'.

Since the reaction temperature of $Ti_xN$ is lower than that of $TiSi_2$, the whole Ti film 107 on the isolation oxide 1102 is consumed by the formation reaction of $Ti_xN$ during the silicidation reaction. This means that the Ti film on the isolation oxide 1102 does not react with Si and consequently, $TiSi_2$ is prevented from being formed on the isolation oxide 1102. This makes it possible to form the C-49-phase $TiSi_2$ films 1109 on the pair of source/drain regions 1106 and the gate electrode 1104 in self alignment to the gate electrode 1104, the pair of sidewall spacers 1105, and the isolation oxide 1102 as desired.

A second example of the conventional fabrication methods of this sort, in which the "overgrowth" phenomenon is avoided, is shown in FIGS. 2A to 2F. This example is disclosed in the Japanese Patent Application No. 7-303928 that corresponds to the Japanese Non-Examined Patent Publication Nos. 9-186104 and 9-186105 published in July 1997.

First, as shown in FIG. 2A, in the same way as that of the first example shown in FIGS. 1A to 1E, the isolation oxide 1102 is formed on the surface region of the single-crystal silicon substrate 1101 to define the device region 1101A. The polysilicon gate electrode 1104 is formed on the surface of the substrate 1101 through the gate oxide film 1103. The pair of sidewall spacers 1105 are formed on the surface of the substrate 1101 at each side of the gate electrode 1104. The pair of source/drain regions 1106 are formed in the device region 1101A at each side of the gate electrode 1104. The state at this state is shown in FIG. 2A.

Subsequently, a Ti film 1107 with a thickness of approximately 20 nm is deposited over the whole substrate 1101 by a sputtering process, as shown in FIG. 2B. Then, a $Ti_xN$ film 1108 with a thickness of approximately 50 nm is deposited on the Ti film 1107 thus deposited over the whole Ti Film 1107 by a sputtering process, as shown in FIG. 2C.

Following this step, the substrate 1101 on which the Ti and $Ti_xN$ films 1107 and 1108 have been deposited is subjected to a first heat-treatment process in an argon (Ar) atmosphere kept at the atmospheric pressure at a temperature of 700° C. for 30 seconds using a lamp annealing apparatus. Thus, silicidation reaction occurs near the interfaces of the Ti film 1107 with the pair of source/drain regions 1106 and the gate electrode 1104, thereby forming $TiSi_2$ layers 1109, as shown in FIG. 2D. These $TiSi_2$ layers 1109 are in the C-49 phase having a comparatively high electric resistivity.

At the same time as this silicidation reaction, the nitrogen atoms existing in the overlying $Ti_xN$ film 1108 are diffused into the Ti film 1107, thereby transforming the Ti film 1107 to a $Ti_xN$ film 1107' due to nitridation reaction.

Subsequently, using a mixture of water solutions of $NH_3$ and $H_2O_2$ as an etchant, the whole $Ti_xN$ film 1108 and the unreacted $Ti_xN$ film 1107' are removed by a wet etching process. As a consequence, the $TiSi_2$ layers 1109 with the C-49 phase are left on the surface regions of the source/drain regions 1106 and the gate electrode 1104, as shown in FIG. 2E.

Moreover, the substrate 1101 on which the C-49-phase $TiSi_2$ layers 1109 have been formed is subjected to a second heat-treatment process in an Ar atmosphere kept at the atmospheric pressure at a temperature of approximately 800° C. for 10 seconds using a lamp annealing apparatus. Thus, the $TiSi_2$ layers 1109 with the C-49 phase are transformed to $TiSi_2$ layers 1111 with the C54-phase having a comparatively low electric resistivity, as shown in FIG. 2F.

The first example of the conventional fabrication methods shown in FIGS. 1A to 1E is effective for forming the C54-phase $TiSi_2$ layers 1111 in self-alignment. However, there arises a problem that these $TiSi_2$ layers 1111 are not formed as desired when the thickness of the layers 1111 are decreased to approximately 30 nm or less.

Specifically, the Ti film 1107 needs to become thinner according to the progressing miniaturization of semiconductor devices. However, the nitridation and silicidation reactions occurring in the Ti film 1107 tend to compete during the first heat-treatment process. Especially, when arsenic (As) is doped into the source/drain regions 1106 and the gate electrode 1104, the rate of the silicidation reaction tends to decrease and at the same time, the rate of the nitridation reaction tends to increase. As a result, the thickness of the $TiSi_2$ layers 1109 becomes extremely small. In rare cases, only the nitridation reaction occurs in the Ti film 1107 and consequently, no $TiSi_2$ layer is formed.

Also, since the $TiSi_2$ layers 1109 are formed in a $N_2$ atmosphere in the first heat-treatment process, the effects applied to the phase transition of the $TiSi_2$ layers 1109 needs to be considered as explained below.

FIG. 3 shows the change of the phase transition temperature of the Ti film 1107 from the C-49 phase to the C54 phase with respect to the thickness of the Ti film 1107. As seen from FIG. 3, when the thickness of the Ti film 1107 is approximately 30 nm or less, the phase transition temperature rises abruptly, which is caused by the fact that the concentration of N existing in the Ti film 1107 increases due to the nitridation reaction. Therefore, the temperature of the second heat-treatment for lowering the electric resistance of the C-49-phase $TiSi_2$ layers 1109 needs to be set higher. The higher temperature of the second heat-treatment affects badly the source/drain regions 1106 to thereby degrade the performance of the semiconductor device (i.e., the MOSFET). Also, this higher temperature decreases the temperature margin with respect to the agglomeration reaction of $TiSi_2$.

On the other hand, the second example of the conventional fabrication methods shown in FIGS. 2A to 2F is effective for activating the silicidation reaction while suppressing the diffusion of N. Thus, the above-described problems in the first example are solved.

Specifically, in the second example, as explained above, the first heat-treatment is performed in an Ar atmosphere. Therefore, the N atoms diffuse from the $Ti_xN$ film 1108 (rather than the atmosphere) into the Ti film 1107 and as a consequence, the concentration of N in the $Ti_xN$ film 1108 becomes lower. Also, the diffusion depth of the N atoms into the Ti film 1107 becomes shallower than the case where the first heat-treatment is carried out in an $N_2$ atmosphere as shown in the first example of FIGS. 1A to 1E. In other words, the diffusion behavior of the N atoms is suppressed effectively.

Due to this suppression of the diffusion of N into the Ti film 1107, the nitridation reaction of Ti is suppressed on the lower side of the Ti film 1107 which is contacted with the source/drain regions 1106. Accordingly, even if the thickness of the Ti film 1107 is decreased to approximately 30 nm or less, desired silicidation reaction will occur on the lower side of the Ti film 1107, realizing formation of the silicide layers 1109 with a desired small thickness.

With the second example of the conventional fabrication methods shown in FIGS. 2A to 2F, however, there is the following problem because the $Ti_xN$ film 1108 is deposited on the Ti film 1107.

Specifically, since the first heat-treatment process is carried out after the formation of the $Ti_xN$ film 1108, the $Ti_xN$ film 1108 tends to be sintered during this heat-treatment process. As a result, the $Ti_xN$ film 1108 tends to have a high stress and a high density. In this case, although the Ti film 1107 is removed by the wet etching process using the mixture of water solutions of $NH_3$ and $H_2O_2$, the sintered $Ti_xN$ film 1108 is difficult to be removed in the same etching process.

To cope with this difficulty in etching, the $Ti_xN$ film 1108 may be overetched so as to be removed entirely in the above wet etching process, or it may be etched entirely by an extra dry etching process after the wet etching process. In these two cases, however, there arises a problem that the underlying $TiSi_2$ layers 1109 tend to be etched during the additional overetching or dry-etching process because the etch selectivity between $TiSi_2$ and $Ti_xN$ is low.

Accordingly, the sheet resistance of the resultant $TiSi_2$ layers 1111 with the C-54 phase tend to fluctuate widely and at the same time, the purpose of decreasing the electric resistance of the $TiSi_2$ layers 1111 becomes difficult to be accomplished.

Moreover, if a Ti film is formed on a Si region surrounded by a dielectric, a $TiSi_2$ layer is formed near the interface between the Ti film and the Si region due to silicidation reaction. In this case, the $TiSi_2$ layer thus formed tends to sink into the Si region from its original level according to the progress of the silicidation reaction. This sinking phenomenon is caused by diffusion of the Si atoms existing in the Si region into the Ti film. Due to the sinking behavior of the $TiSi_2$ layer during the silicidation reaction, the Ti film itself is plastically deformed.

If a $Ti_xN$ film is located on the Ti film, a plastic deformation will occur in the $Ti_xN$ film and the deformation of the $Ti_xN$ film will increase according to the progressing sinking phenomenon of the $TiSi_2$ layer.

If the Si region has an elongated shape with a small width such as 0.5 μm or smaller (i.e., a strip-like shape), the span of the Si region supported by the surrounding dielectric is short. Accordingly, the Si region becomes difficult to be plastically deformed.

The $Ti_xN$ film located on the elongated Si region make it more difficult for the Si region to be plastically deformed by the value of the stress of the $Ti_xN$ film. Thus, the rate of the silicidation reaction becomes lower than the case where the Si region does not have an elongated shape. This means that the nitridation reaction, which competes with the silicidation reaction, becomes superior. Consequently, a desired $TiSi_2$ layer becomes difficult to be formed or no $TiSi_2$ layer is formed.

As explained above, although the second example of the method shown in FIGS. 2A to 2F is able to cope with simple thinning of the $TiSi_2$ layer, it is not applicable to silicidation of the thin and elongated Si region.

SUMMARY OF THE INVENTION

Accordingly, an object of the present invention to provide a fabrication method of a semiconductor device that makes it possible to form a thin and elongated refractory-metal silicide layer while preventing the overgrowth phenomenon.

Another object of the present invention is to provide a fabrication method of a semiconductor device that forms a refractory-metal silicide layer with a uniform thickness even if the refractory-metal silicide layer is thin and elongated.

Still another object of the present invention is to provide a fabrication method of a semiconductor device that prevents the performance or characteristic degradation of a semiconductor device equipped with a thin and elongated refractory-metal silicide layer.

The above objects together with others not specifically mentioned will become clear to those skilled in the art from the following description.

A fabrication method of a semiconductor device according to a first aspect of the present invention is comprised of the following steps (a) to (c):

In the step (a), a first refractory metal film is formed on a silicon region.

In the step (b), a second refractory metal film is formed on the first refractory metal film. The second refractory metal film contains a same refractory metal as the first refractory metal film and nitrogen. A stress of the second refractory metal film is controlled to be a specific value or lower.

In the step (c), the first refractory metal film and the second refractory metal film are heat-treated in an atmosphere excluding nitrogen, thereby forming a refractory-metal silicide layer at an interface between the silicon region and the first refractory metal film due to silicidation reaction of the first refractory metal film with the silicon region.

The value of the stress of the second refractory metal film is set so that the second refractory metal film applies substantially no effect to a plastic deformation of the refractory-metal silicide layer occurring during the silicidation reaction in the step (c).

With the fabrication method of a semiconductor device according to the first aspect of the present invention, after the first refractory metal film is formed on the silicon region in the step (a), the second refractory metal film containing a same refractory metal as the first refractory metal film and nitrogen is formed on the first refractory metal film in the step (b). Subsequently, the first and second refractory metal films are heat-treated in a nitrogen-excluding atmosphere, thereby forming the refractory-metal silicide layer at the interface between the silicon region and the first refractory metal film due to silicidation reaction of the first refractory metal film with the silicon region.

The stress of the second refractory metal film is controlled to be the specific value or lower, where the value of the stress of the second refractory metal film is set so that the second refractory metal film applies substantially no effect to a plastic deformation of the refractory-metal silicide layer occurring during the silicidation reaction in the step (c).

Accordingly, due to the controlled stress of the second refractory metal film as above, the plastic deformation of the refractory-metal silicide layer during the silicidation reaction occurs with substantially no effect of the second refractory metal film. This means that the rate of the silicidation reaction is not or difficult to be decreased due to existence of the second refractory metal film.

As a consequence, a thin and elongated refractory-metal silicide layer is able to be formed on the silicon region even if the silicide layer has a thickness of approximately 30 nm or less and a width of approximately 0.5 μm or less.

Also, no additional etching process is needed to remove the second refractory metal film, and at the same time, the rate of the silicidation reaction is not decreased or difficult to be decreased. Therefore, even if the refractory-metal silicide layer is thin and elongated, this silicide layer has a uniform thickness.

Further, since the step (c) of heat-treating the first and second refractory metal films is carried out in an atmosphere excluding nitrogen, the phase transition temperature for causing phase transition of the refractory-metal silicide layer does not rise even if the refractory-metal silicide layer has a thickness as small as approximately 30 nm or less.

Thus, the performance or characteristic of the semiconductor device is prevented from degrading due to the heat treatment for phase transition.

Additionally, after the second refractory metal film containing nitrogen is formed on the first refractory metal film in the step (b), the first and second refractory metal films are heat-treated in a nitrogen-excluding atmosphere in the step (c), thereby forming the refractory-metal silicide layer at the interface between the silicon region and the first refractory metal film. Accordingly, the nitrogen atoms are diffused into the first refractory metal film from the second refractory metal film (rather than the atmosphere), thereby nitriding the first refractory metal film in the step (c). Thus, the overgrowth phenomenon of the refractory-metal silicide layer on a dielectric located outside the silicon region is avoided.

In a preferred embodiment of the method according to the first aspect of the present invention, the specific value of the stress of the second refractory metal film is $3 \times 10^9$ dyne/cm$^2$. This value makes it sure to derive the advantages of the present invention.

In another preferred embodiment of the method according to the first aspect of the present invention, the first refractory metal film is transformed to a third refractory metal film due to diffusion of the nitrogen contained in the second refractory metal film into the first refractory metal film in the step (c). The third refractory metal film contains a same refractory metal as the first refractory metal film and nitrogen. In this embodiment, the advantages of the present invention are effectively derived.

In this case, it is preferred that the following steps (d) and (e) are additionally provided.

The first refractory metal film and the unreacted third refractory metal film are selectively removed to expose the refractory-metal silicide layer in the step (d). The refractory-metal silicide layer has a first phase.

The refractory-metal silicide layer is heat-treated to have a second phase due to phase transition in the step (e).

In still another preferred embodiment of the method according to the first aspect of the present invention, the step (b) of forming the second refractory metal film is carried out by a reactive sputtering process in an atmosphere including a same refractory metal as the first refractory metal film and nitrogen at a power density of 2.5 W/cm$^2$ or lower.

Instead of the sputtering power density of 2.5 W/cm$^2$ or lower, the reactive sputtering process may be carried out in an atmosphere including a same refractory metal as the first refractory metal film and nitrogen at a pressure of 8 mTorr or higher, or under a condition that the silicon region is kept at a temperature of 400° C. or higher.

In a further preferred embodiment of the method according to the first aspect of the present invention, the nitrogen-excluding atmosphere in the step (c) of heat-treating the first and second refractory metal films is an inert atmosphere or vacuum atmosphere.

It is most preferred that the first refractory metal film is a titanium film and the second refractory metal film is a titanium nitride film, because the advantages of the present invention are derived most effectively.

A fabrication method of a semiconductor device according to a second aspect of the present invention is comprised of the following steps (a) to (g):

In the step (a), an isolation insulator is selectively formed on a surface of a silicon substrate, thereby defining a device region.

In the step (b), a gate insulator is formed on the surface of the substrate in the device region.

In the step (c), a gate electrode is formed on the gate insulator.

In the step (d), insulating sidewall spacers are formed on the surface of the substrate at each side of the gate electrode. The sidewall spacers are contacted with corresponding side faces of the gate electrode.

In the step (e), source/drain regions are formed in the substrate at each side of the gate electrode by introducing an impurity into the device region of the substrate.

In the step (f), a first refractory metal film is formed in contacted with the isolation insulator, the insulating sidewall spacers, and the source/drain regions.

In the step (g), a second refractory metal film is formed on the first refractory metal film. The second refractory metal film contains a same refractory metal as the first refractory-metal film and nitrogen. A stress of the second refractory metal film is controlled to be a specific value or lower.

In the step (h), the first refractory metal film and the second refractory metal film are heat-treated in an atmosphere excluding nitrogen, thereby forming a refractory-metal silicide layer at an interface of the first refractory metal film with the source/drain regions.

The value of the stress of the second refractory metal film is set so that the second refractory metal film applies substantially no effect to a plastic deformation of the refractory-metal silicide layer occurring during the silicidation reaction in the step (c).

With the fabrication method of a semiconductor device according to the second aspect of the present invention, there are the same advantages as those in the method according to the first aspect of the present invention, because the method according to the second aspect corresponds to a method obtained by applying the method according to the first aspect to fabrication of a MOSFET.

In a preferred embodiment of the method according to the second aspect of the present invention, the specific value of the stress of the second refractory metal film is $3 \times 10^9$ dyne/cm$^2$. This value makes it sure to derive the advantages of the present invention.

In another preferred embodiment of the method according to the second aspect of the present invention, the first refractory metal film is transformed to a third refractory metal film due to diffusion of the nitrogen contained in the second refractory metal film into the first refractory metal film in the step (h). The third refractory metal film contains a same refractory metal as the first refractory metal film and nitrogen. In this embodiment, the advantages of the present invention are effectively derived.

In this case, it is preferred that the following steps (i) and (j) are additionally provided.

The first refractory metal film and the unreacted third refractory metal film are selectively removed to expose the refractory-metal silicide layer in the step (i). The refractory-metal silicide layer has a first phase.

The refractory-metal silicide layer is heat-treated to have a second phase due to phase transition in the step (j).

In still another preferred embodiment of the method according to the second aspect of the present invention, the step (g) of forming the second refractory metal film is carried out by a reactive sputtering process in an atmosphere including a same refractory metal as the first refractory metal film and nitrogen at a power density of 2.5 W/cm² or lower.

Instead of the sputtering power density of 2.5 W/cm² or lower, the reactive sputtering process may be carried out in an atmosphere including a same refractory metal as the first refractory metal film and nitrogen at a pressure of 8 mTorr or higher, or under a condition that the silicon region is kept at a temperature of 400° C. or higher.

In a further preferred embodiment of the method according to the second aspect of the present invention, the nitrogen-excluding atmosphere in the step (h) of heat-treating the first and second refractory metal films is an inert atmosphere or vacuum atmosphere.

It is most preferred that the first refractory metal film is a titanium film and the second refractory metal film is a titanium nitride film, because the advantages of the present invention are derived most effectively.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1A:
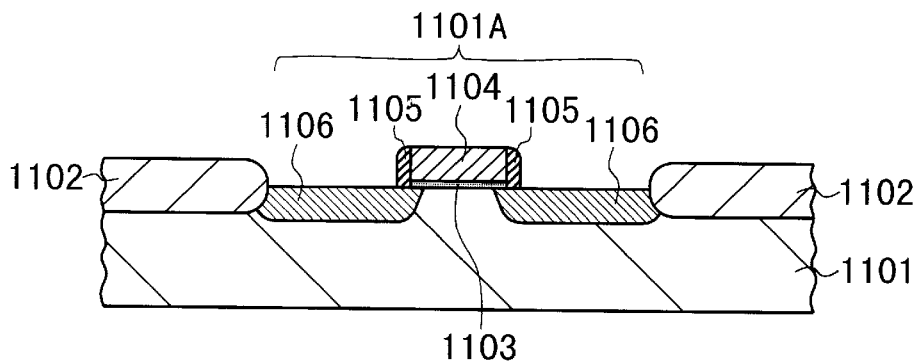
FIGS. 1A to 1E are schematic, partial cross-sectional views showing the process steps of a first example of the conventional fabrication methods of a semiconductor device, respectively.
Figure 1B:
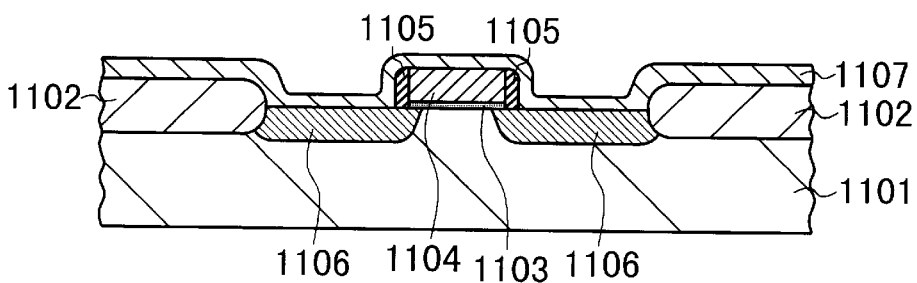
Figure 1C:
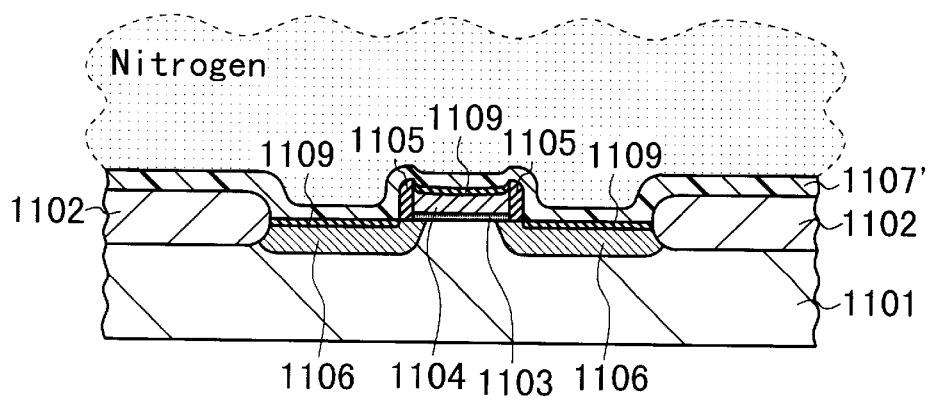
Figure 1D:
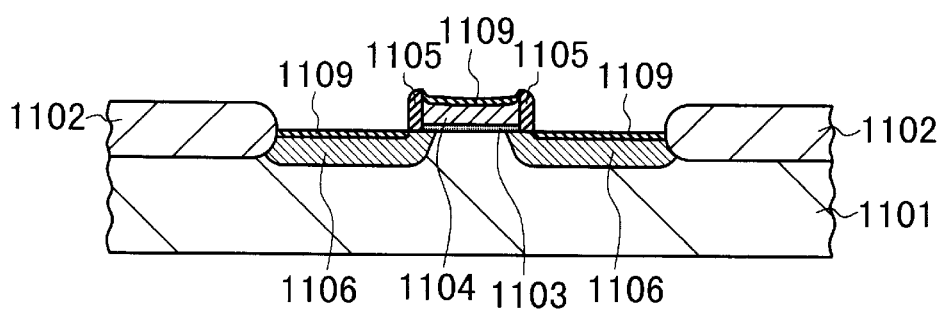
Figure 1E:
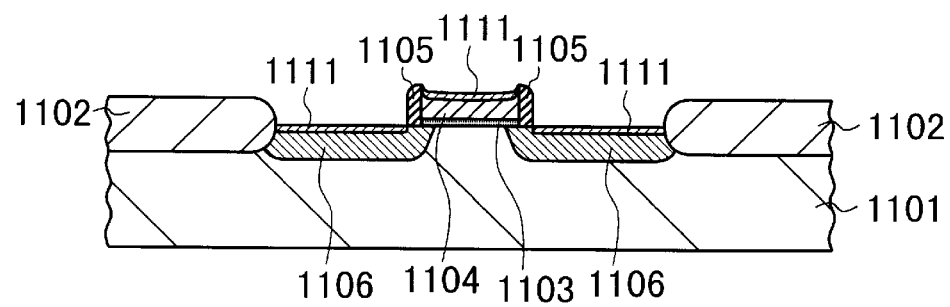
Figure 2A:
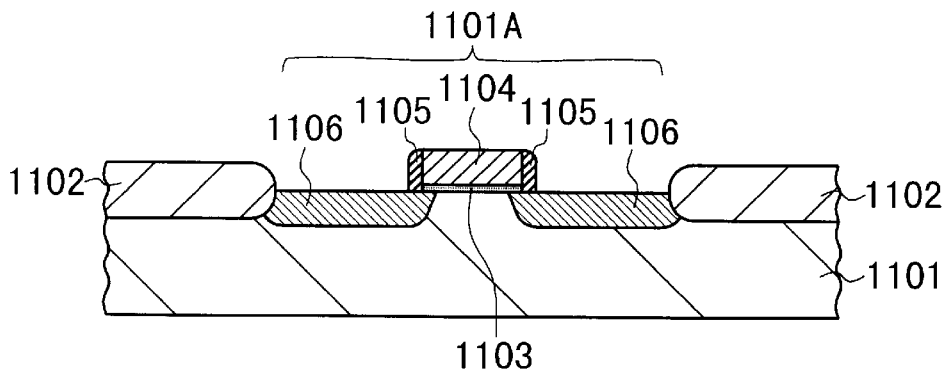
FIGS. 2A to 2F are schematic, partial cross-sectional views showing the process steps of a second example of the conventional fabrication methods of a semiconductor device, respectively.
Figure 2B:
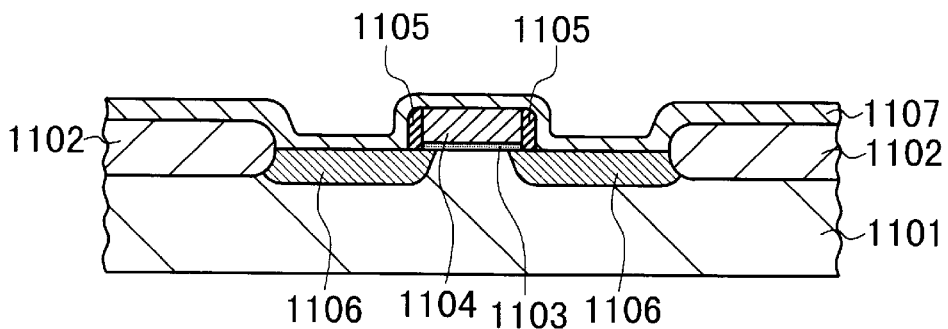
Figure 2C:
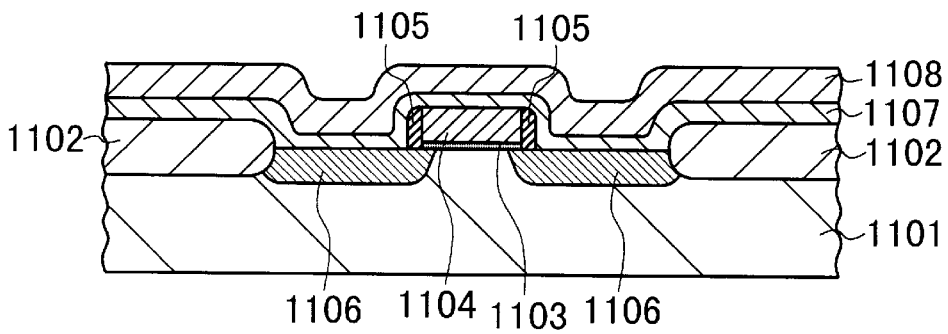
Figure 2D:
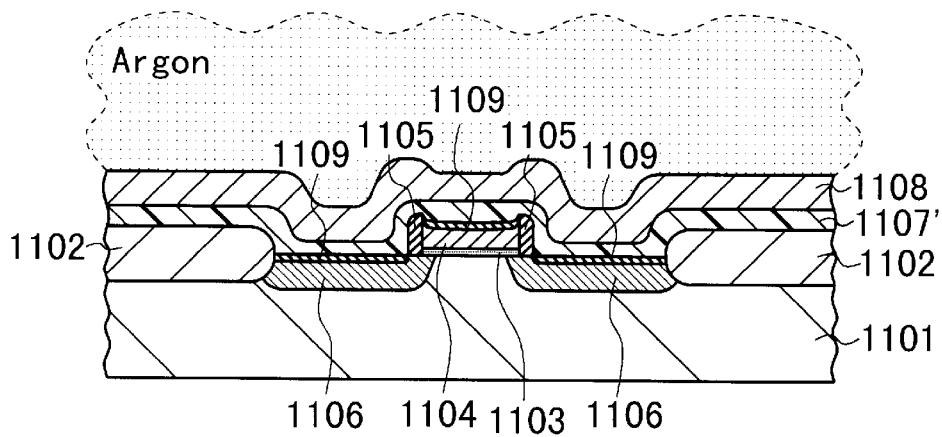
Figure 2E:
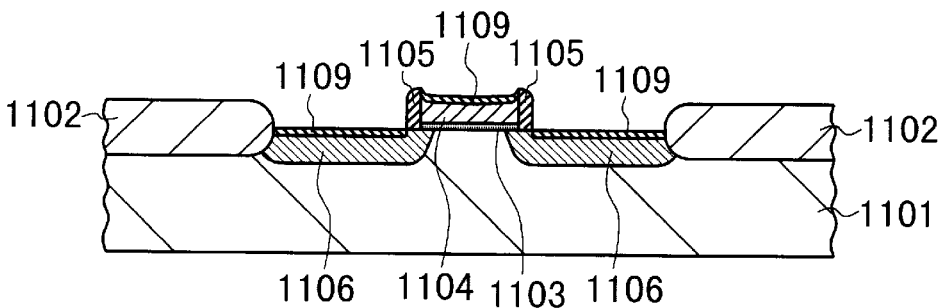
Figure 2F:
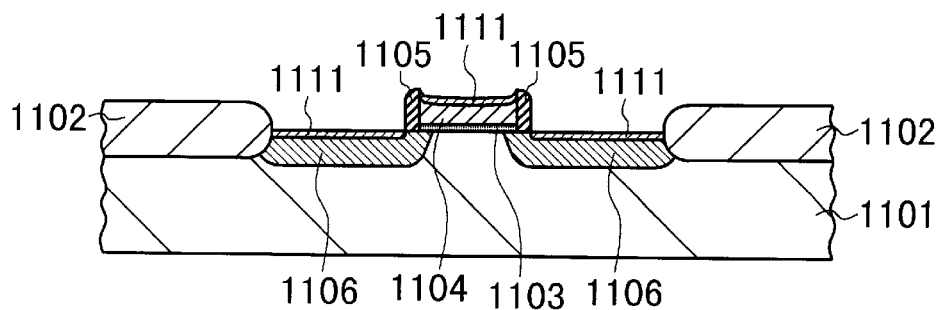
Figure 3:
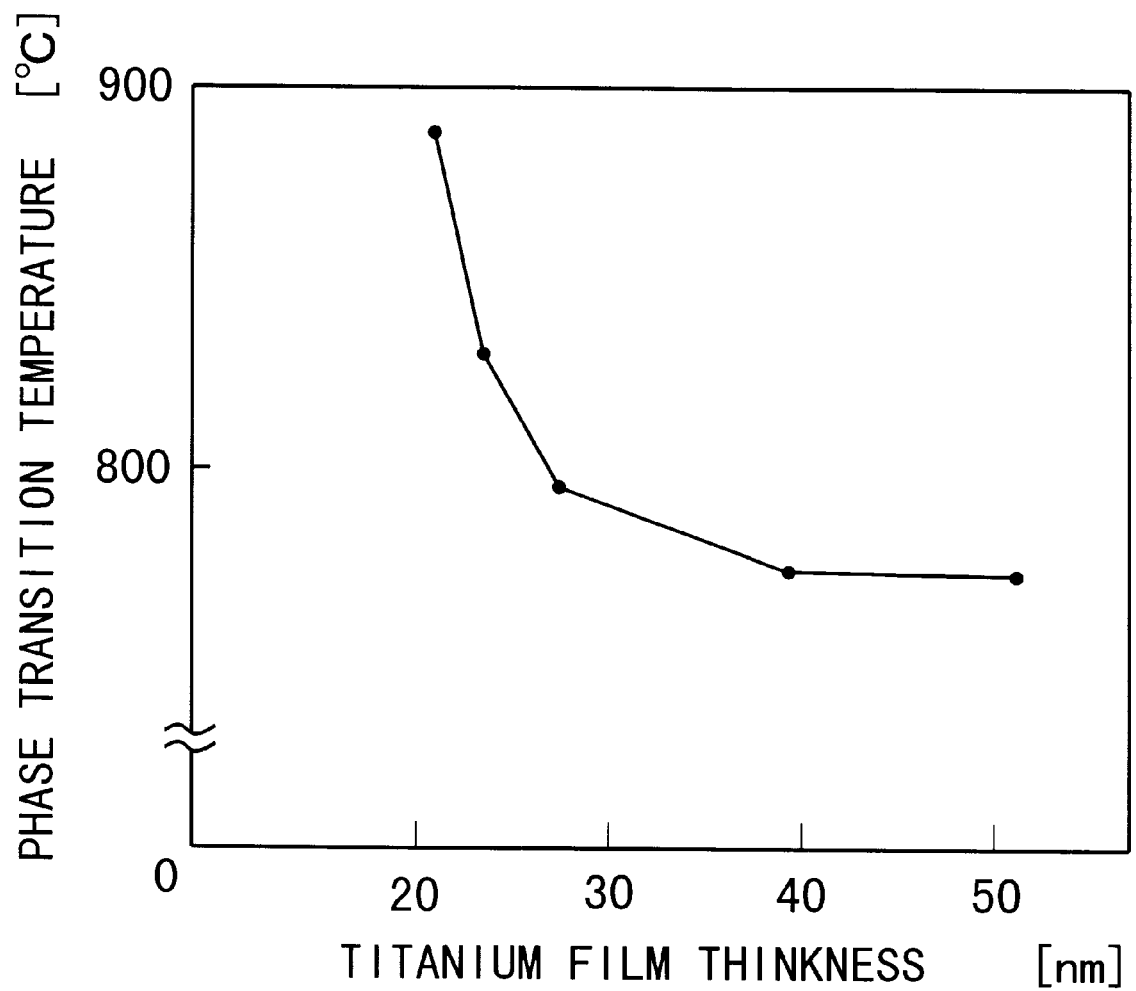
FIG. 3 is a graph showing the relationship between the phase-transition temperature of the titanium silicide film and the thickness thereof.

Preferred embodiments of the present invention will be described in detail below while referring to the drawings attached.

FIRST EMBODIMENT

FIGS. 4A to 4F show a fabrication method of a semiconductor device having a MOSFET according to a first embodiment of the present invention.

Figure 4A:
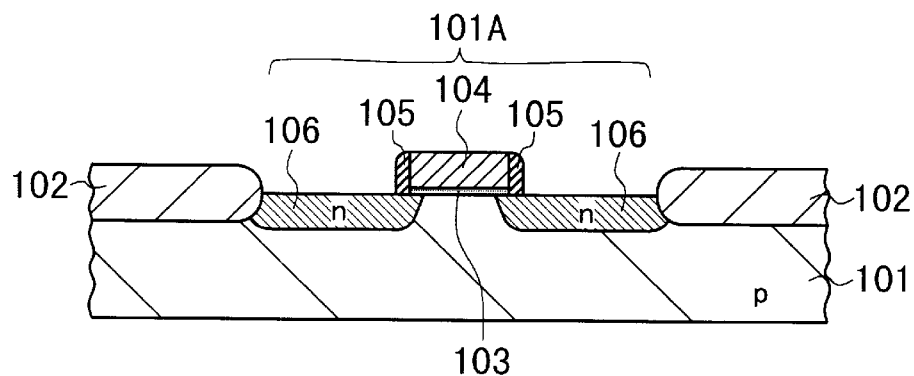
FIGS. 4A to 4E are schematic, partial cross-sectional views showing the process steps of a fabrication method of a semiconductor device according to a first embodiment of the present invention, respectively.

In this method, first, as shown in FIG. 4A, an isolation oxide 102 made of $SiO_2$ is selectively formed on the surface region of a p-type single-crystal Si substrate 101 by a LOCOS process, thereby defining a device region 101A in which the MOSFET is formed. An impurity is selectively ion-implanted into the substrate 101 to form channel stop regions, thereby raising the dielectric breakdown voltage.

Instead of the p-type substrate 101, an n-type single-crystal Si substrate having a p-type well may be used.

A $SiO_2$ film 103 with a thickness of approximately 8 nm is formed on the whole exposed surface of the substrate 101 in the device region 101A by a thermal oxidation process.

Then, a polycrystalline Si (i.e., polysilicon) film (not shown) with a thickness of approximately 100 nm is deposited on the $SiO_2$ film 103 over the whole substrate 101 by a CVD process. The polysilicon film thus formed is doped with an impurity such as phosphorus (P) to lower its electric resistance. The polysilicon film having the lowered electric resistance is then patterned to a specific plan shape, thereby forming a gate electrode 104 on the $SiO_2$ film 103 in the device region 101A.

A $SiO_2$ film (not shown) with a thickness of approximately 100 nm is deposited over the whole substrate 101 to cover the polysilicon gate electrode 104, the $SiO_2$ film 103, and the isolation oxide 102 made of $SiO_2$ by a CVD process. Then, the $SiO_2$ film thus deposited, the $SiO_2$ film 103, and the isolation oxide 102 are etched by an anisotropic etching process, thereby forming a pair of sidewall spacers 105 on the surface of the substrate 101 at each side of the gate electrode 104. The pair of sidewall spacers 105, which are made of $SiO_2$, are contacted with the corresponding side faces of the gate electrode 104.

During this anisotropic etching process, the surface of the substrate 101 is uncovered at the locations corresponding to a pair of source/drain regions. The remaining $SiO_2$ film 103 serves as a gate oxide film. The gate electrode 104 is located on the gate oxide film 103 thus formed.

Subsequently, an n-type impurity such as arsenic (As) is selectively implanted into the device region 101A of the substrate 101 by an ion-implantation process. The dose of the n-type impurity is, for example, set as $1 \times 10^{15}$ atoms/$cm^2$. The substrate 101 is then subjected to a heat treatment at a temperature of approximately 900° C. Thus, a pair of source/drain regions 106 are formed in the device region 101A at each side of the gate electrode 104. The pair of source/drain regions 106 thus formed are in self alignment to the gate electrode 104, the pair of sidewall spacers 105, and the isolation oxide 102. The state at this stage is shown in FIG. 4A.

Figure 4B:
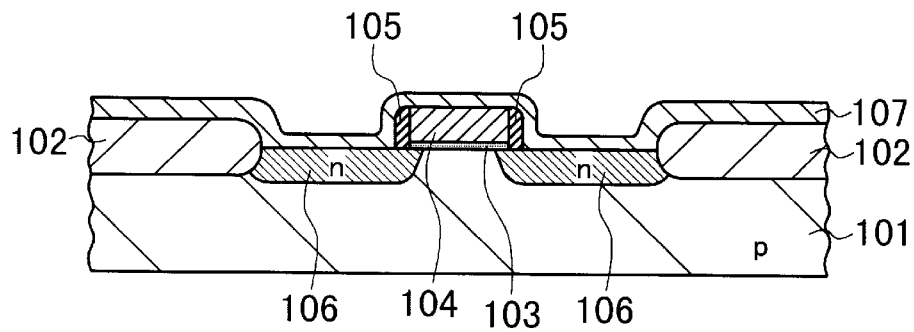

Following this step of forming the source/drain regions 106, a titanium (Ti) film 107 with a thickness of approximately 20 nm is deposited over the whole substrate 101 by a reactive sputtering process, as shown in FIG. 4B. This sputtering process is carried out by using a Ti target and an argon (Ar) atmosphere.

Figure 4C:
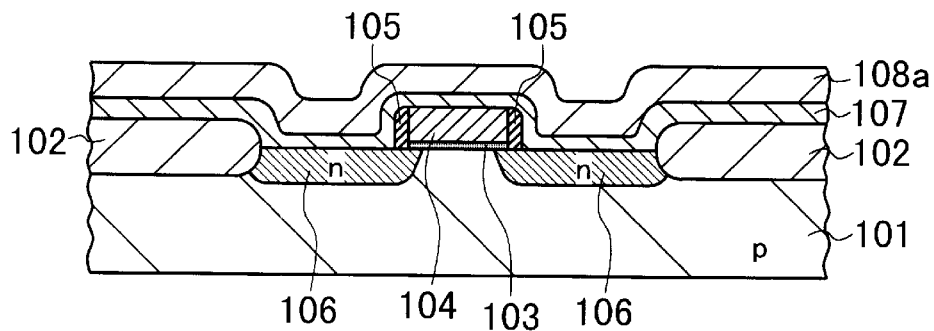

On the Ti film 107, a titanium nitride ($Ti_xN$) film 108a with a thickness of approximately 20 nm is deposited over the whole substrate 101 by a reactive sputtering process, as shown in FIG. 4C, where $x \geq 1$. This sputtering process is carried out under the following condition.

(i) Target: Ti target with a diameter of 30 cm (ii) Atmosphere: mixture of Ar and $N_2$.

(iii) Flow rates of Ar and $N_2$: equal (iv) Pressure of atmosphere: 3 mTorr (v) Temperature of substrate: approximately 200° C.

(vi) Sputtering power: 0.5 to 1.5 kW

Figure 5:
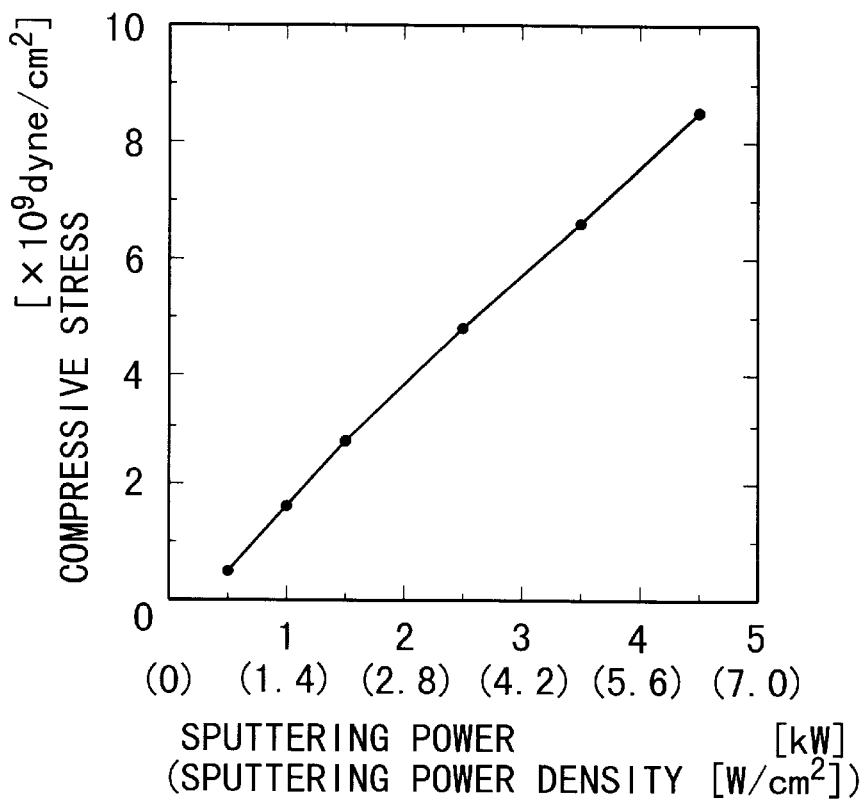
FIG. 5 is a graph showing the relationship of the compressive stress of the titanium nitride film with the sputtering power or the sputtering power density in the fabrication method according to the first embodiment.

It is preferred that the sputtering power is set as the lowest value of 0.5 kW, the reason of which is seen from FIG. 5.

FIG. 5 shows the relationship of the compressive stress of the $Ti_xN$ film 108a with the sputtering power or the sputtering power density in this first embodiment. As seen from FIG. 5, the compressive stress of the $Ti_xN$ film 108a decreases with the lowering sputtering power or sputtering power density. This means that not only the sputter rate of the $Ti_xN$ film 108a but also the compressive stress thereof decrease according to the lowering sputtering power or sputtering power density. The compressive stress of the $Ti_xN$ film 108a decreases monotonously from $8.5 \times 10^{19}$ dyne/$cm^2$ at 4.5 kw (=6.3 W/$cm^2$) to $0.5 \times 10^{19}$ dyne/$cm^2$ at 0.5 kW (=0.7 W/$cm^2$). The compressive stress is $3.0 \times 10^{19}$ dyne/$cm^2$ at 1.5 kW (=2.1 W/$cm^2$).

Figure 4D:
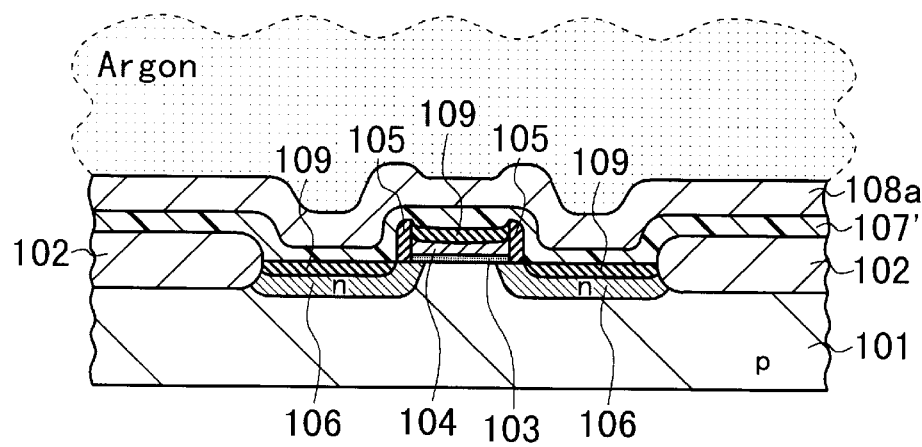

Subsequently, the substrate 101 on which the Ti and $Ti_xN$ films 107 and 108a have been deposited is subjected to a first heat-treatment process in an Ar atmosphere at a temperature of 700° C. for 30 seconds using a lamp annealing apparatus. Thus, as shown in FIG. 4D, silicidation reaction occurs near the interfaces of the Ti film 107 with the single-crystal Si source/drain regions 106 and the polysilicon gate electrode 104, thereby forming titanium silicide ($TiSi_2$) layers 109. These $TiSi_2$ layers 109 are in the C-49 phase having a comparatively high electric resistivity of approximately 60 $\mu\Omega$·cm.

In the first heat-treatment process, the compressive stress of the $Ti_xN$ film 108a turns to a tensile stress. The tensile stress of the $Ti_xN$ film 108a after the first heat-treatment becomes lower according to decrease of the sputtering power. The silicidation reaction of Ti is a volume-decrease reaction and therefore, the higher the tensile stress of the $Ti_xN$ film 108a increases the lower the rate of the silicidation reaction decreases. Thus, it is preferred that the sputtering power density is set at a possibly low value so that the resultant tensile stress of the $Ti_xN$ film 108a becomes possibly low.

At the same time as this silicidation reaction, the N atoms existing in the overlying $Ti_xN$ film 108a are diffused into the Ti film 107, thereby transforming the Ti film 107 to a $Ti_xN$ film 107' due to nitridation reaction. Due to existence of the $Ti_xN$ film 107', the $TiSi_2$ layers 109 are not grown on the isolation oxide 102, which means that overgrowth phenomenon is prevented from occurring.

Figure 4E:
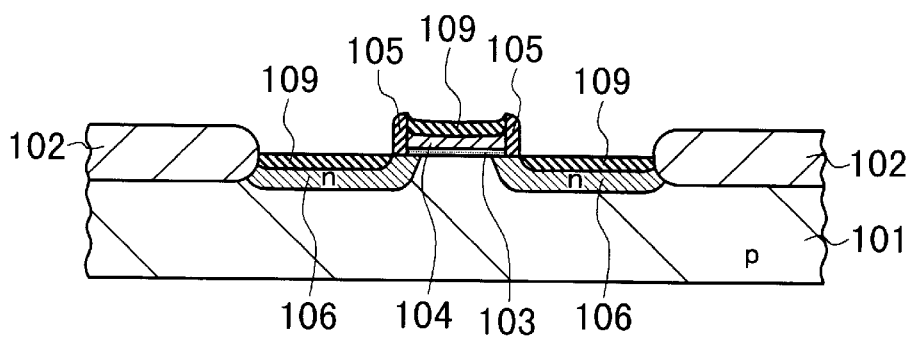

Subsequently, using a mixture of water solutions of ammonia ($NH_3$) and hydrogen peroxide ($H_2O_2$) as an etchant, the whole $Ti_xN$ film 108a and the unreacted $Ti_xN$ film 107' are removed by a wet etching process. As a consequence, the $TiSi_2$ layers 109 are left in the surface regions of the source/drain regions 106 and the gate electrode 104, respectively, as shown in FIG. 4E.

Figure 6:
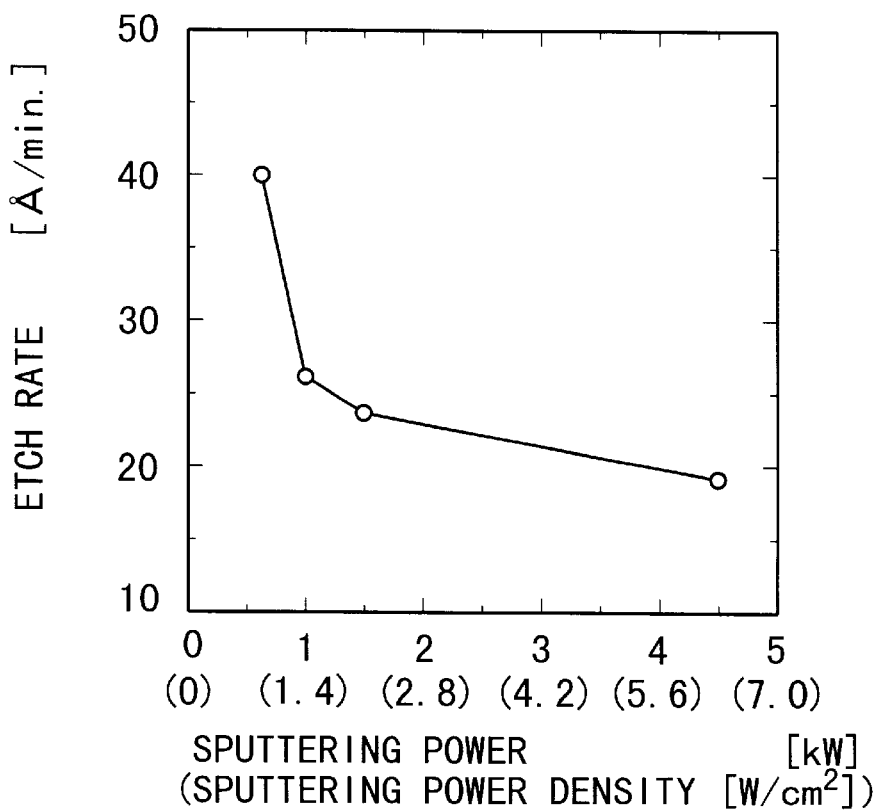
FIG. 6 is a graph showing the relationship of the compressive etch rate of the titanium nitride film with the sputtering power or the sputtering power density in the fabrication method according to the first embodiment.

FIG. 6 shows the relationship of the etch rate of the $Ti_xN$ film 108a with the sputtering power or the sputtering power density in this wet etching process. As seen from FIG. 6, when the sputtering power is 2 kW or the sputtering power density is 2.8 W/$cm^2$ or higher, no large change is seen in the etch rate of the $Ti_xN$ film 108a. However, when the sputtering power is 1.5 kW or the sputtering power density is 2.1 W/$cm^2$ or lower, the etch rate of the $Ti_xN$ film 108a is increased up to approximately twice. This means that the etch rate of the $Ti_xN$ film 108a becomes abruptly higher if the sputtering process for the $Ti_xN$ film 108a is carried out at a sputtering power density of 2.1 kW/$cm^2$ or lower. A critical point seems to exist between 2.1 kW/$cm^2$ and 2.8 kW/$cm^2$. It was found by the inventors that a critical point exists at approximately 2.5 kW/$cm^2$.

The reason why the $Ti_xN$ film 108a has a high etch rate is considered as follows.

Due to the low sputtering power density, the kinetic energy of the Ti particles sputtered from the Ti target becomes low, which decreases the binding energy of the $Ti_xN$ film 108a. The low binding energy leads to a low density and a lot of voids and thus, the $Ti_xN$ film 108a has a low stress and a high etch rate.

The lowering of the stress of the $Ti_xN$ film 108a is equivalent to the decrease of the thickness thereof, which facilitates the sinking behavior of the $TiSi_2$ layers 109 during the silicidation reaction and prevents the rate of the silicidation reaction from decreasing.

In the method according to the first embodiment, the sputtering power is 0.5 kW which is equal to the sputtering power density of 0.7 W/$cm^2$. Therefore, the etch rate of the $Ti_xN$ film 108a is as high as approximately 40 angstroms/$cm^2$, which is approximately equal to twice the etch rate at the sputtering power density of 2.1 W/$cm^2$. Thus, the advantages of the present invention are effectively derived.

Figure 4F:
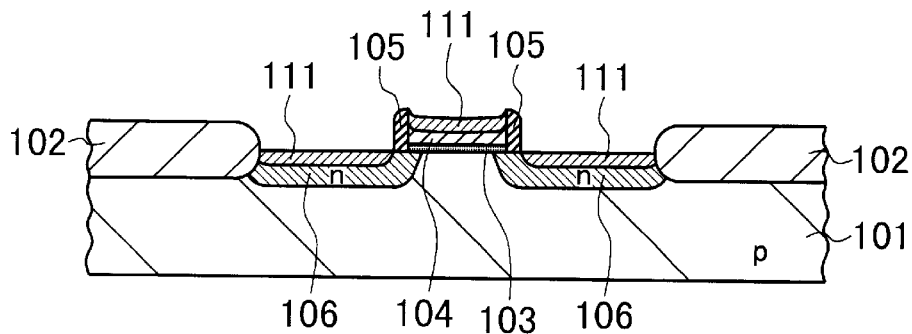

After the wet etching process, the substrate 101 on which the $SiN_x$ layers 109 have been formed is subjected to a second heat-treatment process in an Ar atmosphere under the atmospheric pressure at a temperature of approximately 800° C. for 10 seconds using a lamp annealing apparatus. Thus, the $TiSi_2$ layers 109 with the C-49 phase are turned to $TiSi_2$ layers 111 with the C54-phase having a comparatively low electric resistivity of approximately 20 $\mu\Omega$·cm, as shown in FIG. 4F.

Figure 7:
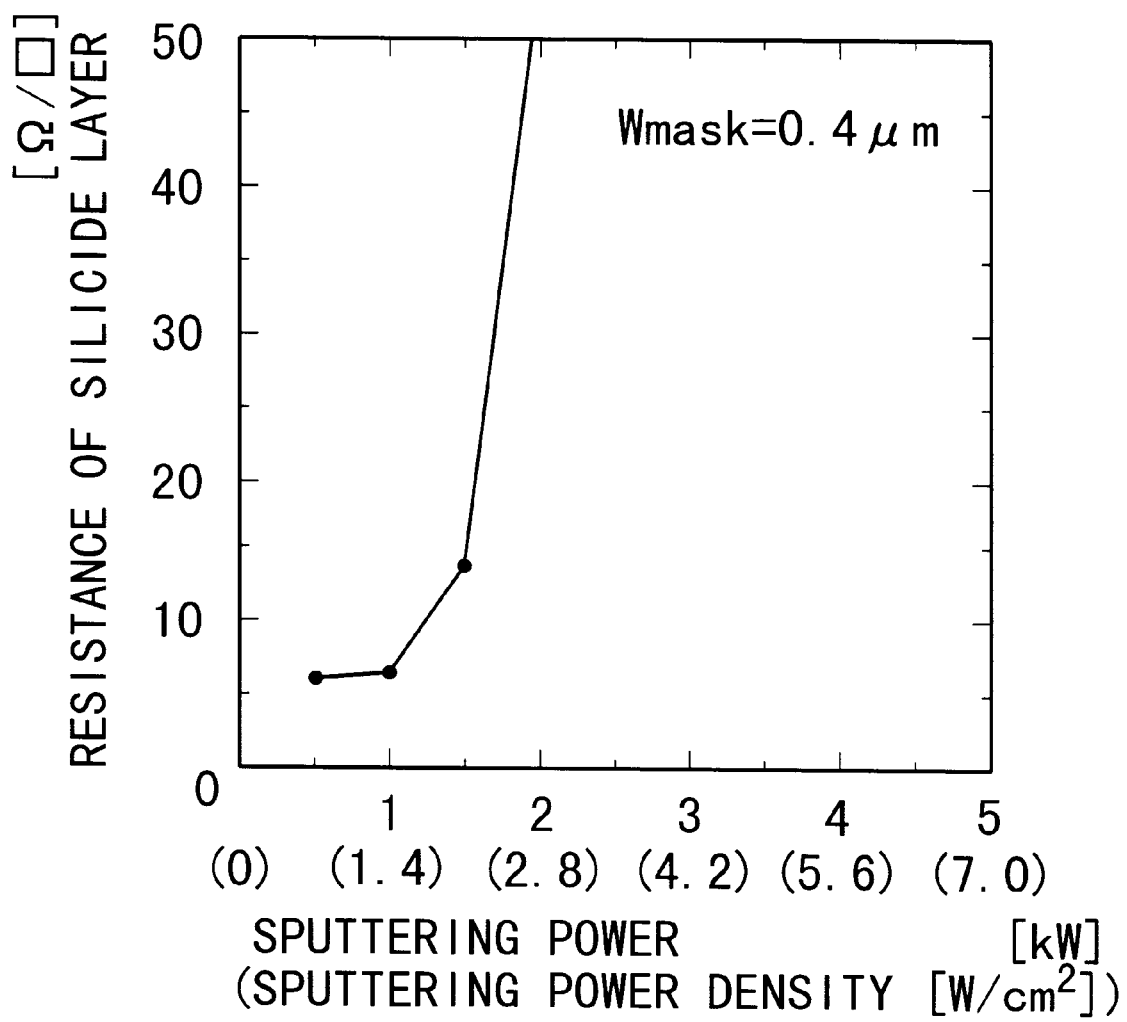
FIG. 7 is a graph showing the relationship of the electric sheet resistance of a titanium silicide layer with the sputtering power or the sputtering power density in the fabrication method according to the first embodiment.

FIG. 7 shows the relationship of the electric sheet resistance of the $TiSi_2$ layers 111 having the C54-phase with the sputtering power or the sputtering power density. As seen from FIG. 7, when the sputtering process for the $Ti_xN$ film 108a is carried out at a sputtering power density of 2.1 kW/$cm^2$ or lower, in which the etch rate of the $Ti_xN$ film 108a is high, the electric sheet resistance of the $TiSi_2$ layers 111 is very low.

As explained above, with the fabrication method of a semiconductor device according to the first embodiment, after the Ti film 107 is formed on the substrate 101, the $Ti_xN$ film 108a is formed on the Ti film 107. Subsequently, the Ti and $Ti_xN$ films 107 and 108a are heat-treated in the Ar atmosphere, thereby forming the $TiSi_2$ layers 109 at the interface between the source/drain regions 106 and the gate electrode 104 due to silicidation reaction of the Ti film 107.

The value of the stress of the $Ti_xN$ film 108a is set so that the $Ti_xN$ film 108a applies substantially no effect to a plastic deformation of the $TiSi_2$ layers 109 during the silicidation reaction.

Accordingly, due to the low stress of the $Ti_xN$ film 108a, the plastic deformation of the $TiSi_2$ layers 109 during the silicidation reaction occurs with substantially no effect of the second refractory metal film. This means that the rate of the silicidation reaction is not or difficult to be decreased due to existence of the $Ti_xN$ film 108a.

As a consequence, even if the TiSi$_2$ layers 109 have a small thickness of approximately 30 nm or less and a narrow width of approximately 0.5 μm or less, they able to be formed on the source/drain regions 106 and the gate electrode 104.

Also, no additional etching process is needed to remove the Ti$_x$N film 109, and at the same time, the rate of the silicidation reaction is not decreased or difficult to be decreased. Therefore, even if the TiSi$_2$ layers 109 are thin and elongated, they have a uniform thickness.

Further, since the first heat-treatment process for the Ti and Ti$_x$N films 107 and 108a is carried out in the Ar atmosphere, the phase transition temperature for causing phase transition of the TiSi$_2$ layers 109 does not rise even if the TiSi$_2$ layers 109 have a thickness as small as approximately 30 nm or less.

Thus, the performance or characteristic of the semiconductor device is prevented from degrading due to the heat treatment for phase transition.

Additionally, after the Ti$_x$N film 108a is formed on the Ti film 107, the Ti and Ti$_x$N films 107 and 108a are heat-treated in the Ar atmosphere, thereby forming the TiSi$_2$ layers 109. Accordingly, the nitrogen atoms are diffused into the Ti film 107 from the Ti$_x$N film 108a (rather than the atmosphere), thereby nitriding the Ti film 107 in this process. Thus, the overgrowth phenomenon of the TiSi$_2$ layers 109 on the isolation oxide 102 is avoided.

SECOND EMBODIMENT

Figure 8A:
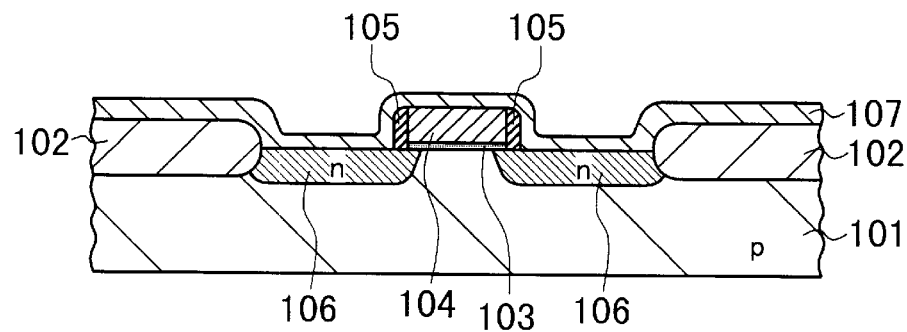
FIGS. 8A to 8C are schematic, partial cross-sectional views showing the process steps of a fabrication method of a semiconductor device according to a second embodiment of the present invention, respectively.
Figure 8B:
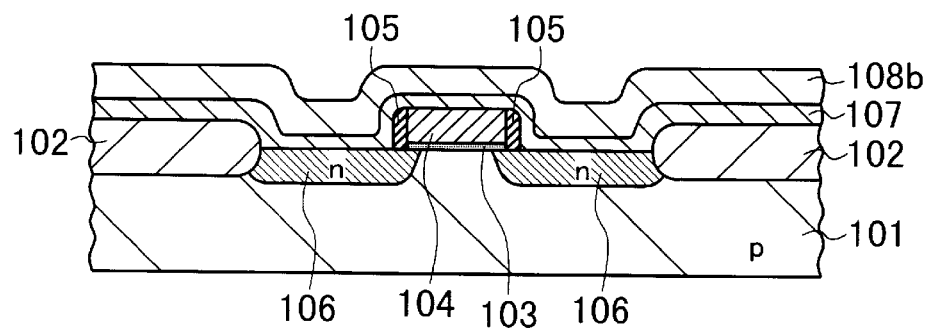
Figure 8C:
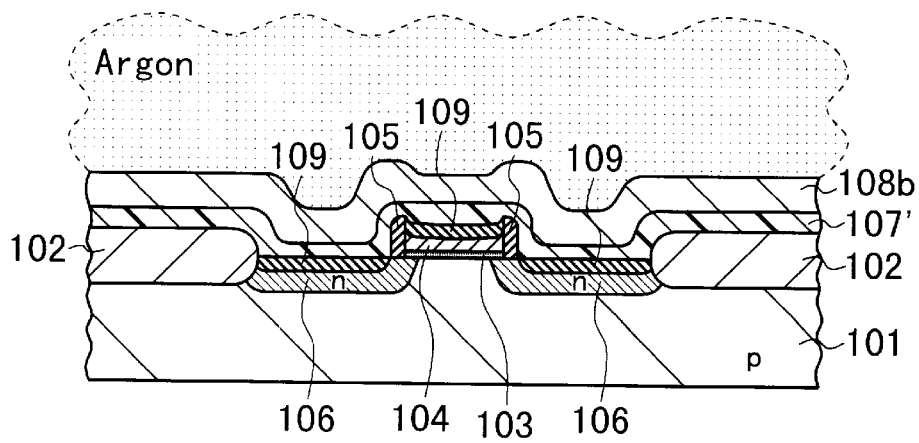

FIGS. 8A to 8C show a fabrication method of a semiconductor device having a MOSFET according to a second embodiment of the present invention.

The method according to the second embodiment includes the same process steps as those in the method according to the first embodiment except that the sputtering pressure is controlled instead of the sputtering power density in the sputtering process for the Ti$_x$N film 108a. Therefore, explanation about the same process steps as those in the first embodiment is omitted here by attaching the same reference numerals to the same elements in FIGS. 8A to 8C for the sake of simplification.

First, in the same way as that of the first embodiment, the isolation oxide 102, the gate oxide film 103, the gate electrode 104, the insulating sidewall spacers 105, and the source/drain regions 106 are formed in, on, or over the substrate 101. Then, the Ti film 107 with a thickness of approximately 20 nm is deposited over the whole substrate 101 by a reactive sputtering process in the same way as that of the first embodiment. The state at this stage is shown in FIG. 8A.

Subsequently, as shown in FIG. 8B, a Ti$_x$N film 108b with a thickness of approximately 20 nm is deposited on the Ti film 107 over the whole substrate 101 by a reactive sputtering process under the following condition.

(i) Target: Ti target with a diameter of 30 cm
(ii) Atmosphere: mixture of Ar and N$_2$.
(iii) Flow rates of Ar and N$_2$: equal
(iv) Pressure of atmosphere: 3 mTorr to 12 mTorr
(v) Temperature of substrate: approximately 200° C.
(vi) Sputtering power: 4.5 kW (≈6.4 W/cm$^2$)

The sputtering pressure is changed by changing the total flow rate of the mixture of Ar and N$_2$ while equalizing the individual flow rates of Ar and N$_2$.

Figure 9:
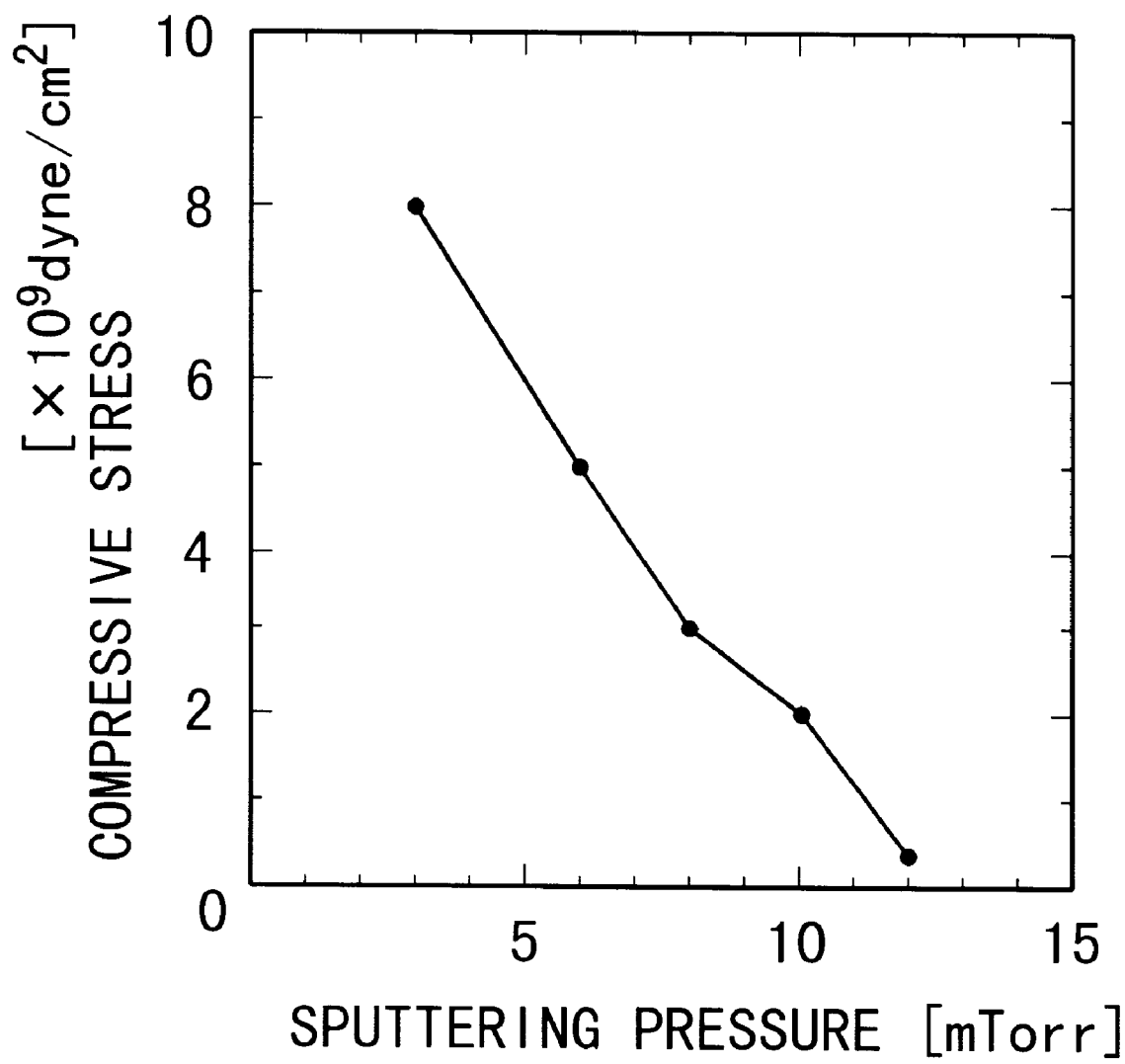
FIG. 9 is a graph showing the relationship of the compressive stress of the titanium nitride film with the sputtering pressure in the fabrication method according to the second embodiment.

It is preferred that the sputtering pressure is equal to approximately 12 mTorr, the reason of which is seen from FIG. 9.

FIG. 9 shows the relationship of the compressive stress of the Ti$_x$N film 108b with the sputtering pressure in the second embodiment. As seen from FIG. 9, the compressive stress of the Ti$_x$N film 108b decreases with the rising sputtering pressure. The compressive stress of the Ti$_x$N film 108b decreases monotonously from 8.0×10$^{19}$ dyne/cm$^2$ at 3 mTorr to 0.5×10$^{19}$ dyne/cm$^2$ at 12 mTorr. The compressive stress is 3.0×10$^{19}$ dyne/cm$^2$ at 8 mTorr.

The reason why the Ti$_x$N film 108b has a low compressive stress is considered as follows.

Due to the high sputtering pressure, the sputtering voltage becomes low, which decreases the kinetic energy of the sputtered particles of Ti. This is equivalent to the lowering of the sputtering power or sputtering power density as shown in the first embodiment. Thus, the Ti$_x$N film 108b has a low stress and a high etch rate.

Subsequently, the substrate 101 on which the Ti and Ti$_x$N films 107 and 108b have been deposited is subjected to a first heat-treatment process in an Ar atmosphere in the same way as the first embodiment, thereby forming TiSi$_2$ layers 109 with the C-49 phase, as shown in FIG. 8B.

The whole Ti$_x$N film 108b and the unreacted Ti$_x$N film 107' are removed by a same wet etching process as in the first embodiment, thereby leaving the TiSi$_2$ layers 109 in the surface regions of the source/drain regions 106 and the gate electrode 104, respectively.

Finally, the substrate 101 on which the SiN$_x$ layers 109 have been formed is subjected to a second heat-treatment process in an Ar atmosphere in the same way as in the first embodiment. Thus, the TiSi$_2$ layers 109 with the C-49 phase are turned to TiSi$_2$ layers 111 with the C54-phase.

It is obvious that the method according to the second embodiment has the same advantages as those in the first embodiment.

There is an additional advantage that the maximum performance of a sputtering apparatus is able to be utilized and that the necessary sputtering period is shorter (i.e., the sputtering rate is higher) than the method according to the first embodiment.

For example, it takes 3 minutes or longer to grow the Ti$_x$N film 18a with a thickness of 20 nm in the method according to the first embodiment, where the sputtering power density is approximately 0.7 W/cm$^2$. On the other hand, in the method according to the second embodiment, it takes only 20 seconds or shorter to grow the Ti$_x$N film 18b with a same thickness.

THIRD EMBODIMENT

Figure 10A:
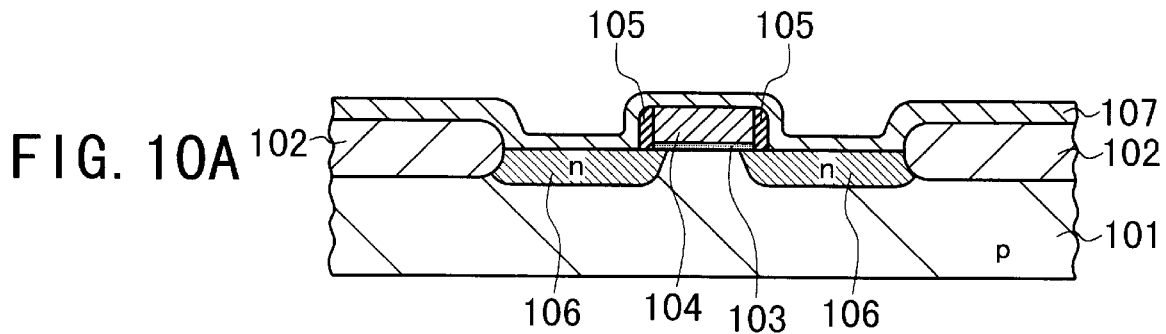
FIGS. 10A to 10C are schematic, partial cross-sectional views showing the process steps of a fabrication method of a semiconductor device according to a third embodiment of the present invention, respectively.
Figure 10B:
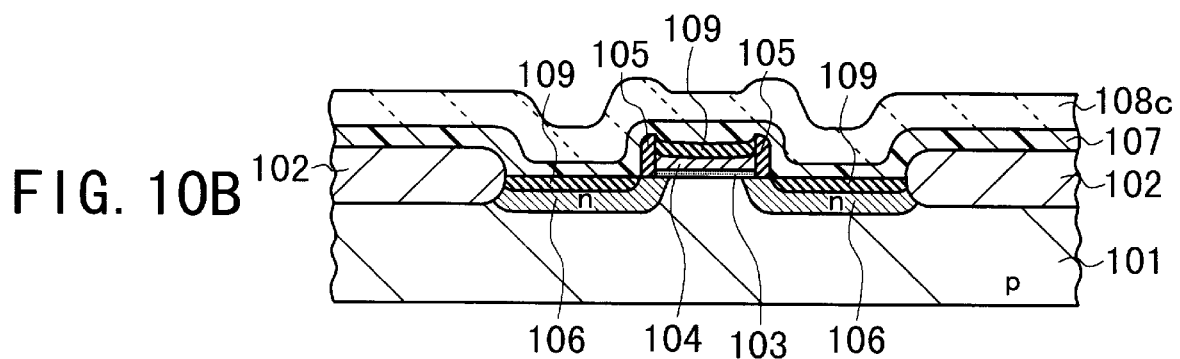
Figure 10C:
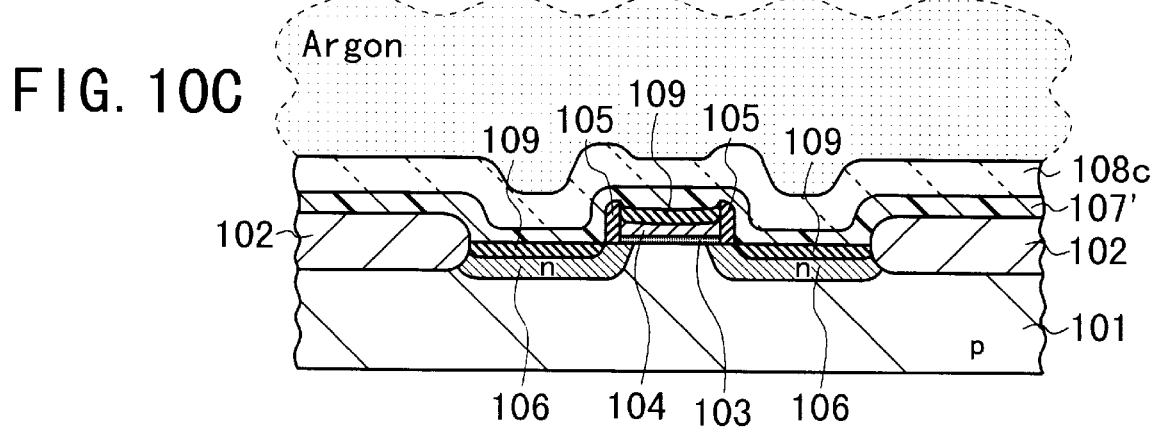

FIGS. 10A to 10C show a fabrication method of a semiconductor device having a MOSFET according to a third embodiment of the present invention.

The method according to the third embodiment includes the same process steps as those in the method according to the first embodiment except that the temperature of the substrate 101 is controlled instead of the sputtering power density in the sputtering process for the Ti$_x$N film 108a. Therefore, explanation about the same process steps as those in the first embodiment is omitted here by attaching the same reference numerals to the same elements in FIGS. 10A to 10C.

First, in the same way as that of the first embodiment, the isolation oxide 102, the gate oxide film 103, the gate electrode 104, the insulating sidewall spacers 105, and the source/drain regions 106 are formed in, on, or over the substrate 101. Then, the Ti film 107 with a thickness of approximately 20 nm is deposited over the whole substrate 101 by a reactive sputtering process in the same way as that of the first embodiment. The state at this stage is shown in FIG. 10A.

Subsequently, as shown in FIG. 10B, a $Ti_xN$ film 108c with a thickness of approximately 20 nm is deposited on the Ti film 107 over the whole substrate 101 by a reactive sputtering process under the following condition.

(i) Target: Ti target with a diameter of 30 cm
(ii) Atmosphere: mixture of Ar and $N_2$.
(iii) Flow rates of Ar and $N_2$: equal
(iv) Pressure of atmosphere: 3 mTorr
(v) Temperature of substrate: 50° C. to 450° C.
(vi) Sputtering power: 4.5 kW ($\approx$6.4 W/cm$^2$)

Figure 11:
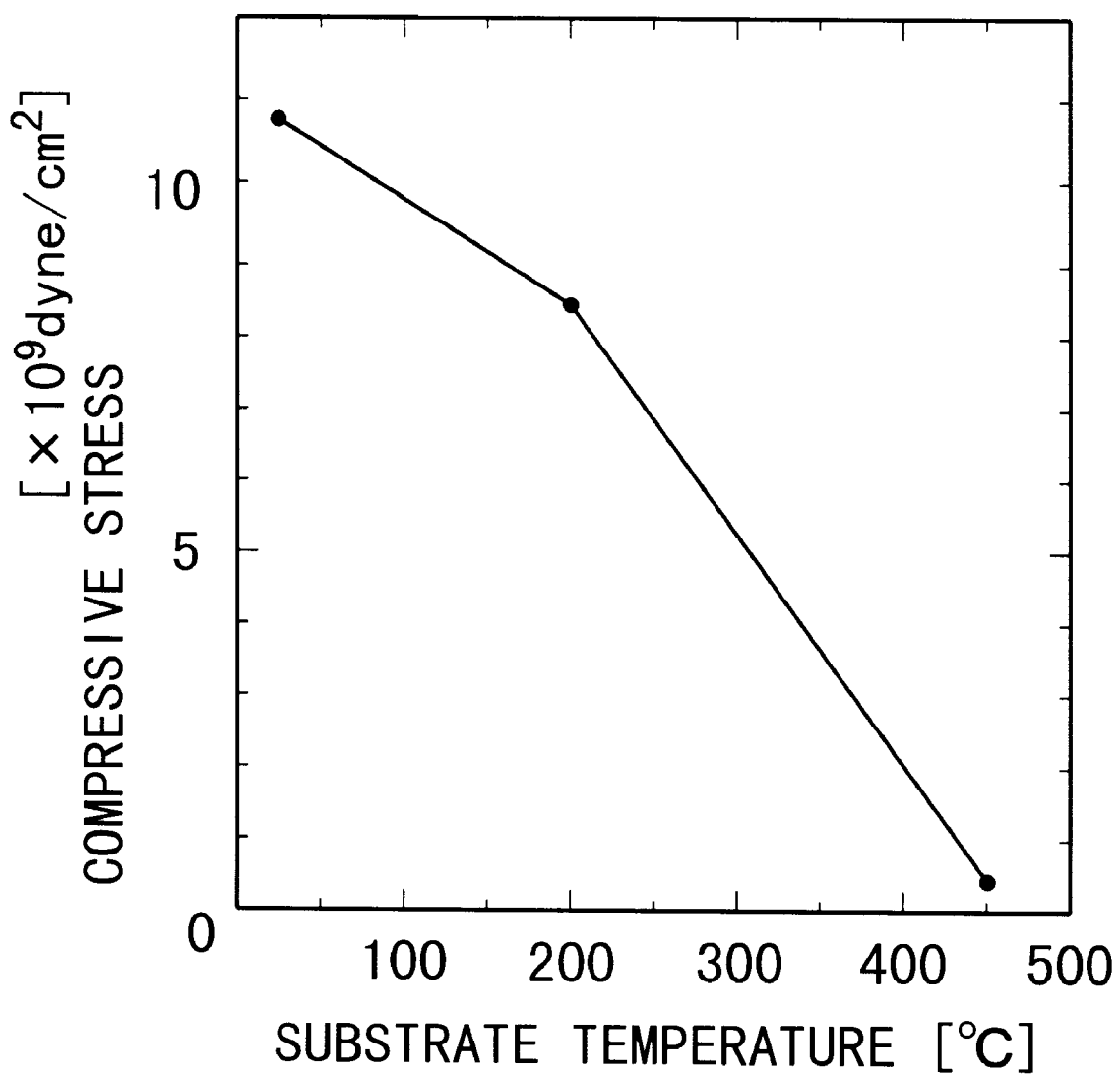
FIG. 11 is a graph showing the relationship of the compressive stress of a titanium nitride film with the substrate temperature in the fabrication method according to the third embodiment.

It is preferred that the temperature of the substrate 101 is equal to 400° C. or higher, the reason of which is seen from FIG. 11.

FIG. 11 shows the relationship of the compressive stress of the $Ti_xN$ film 108c with the temperature of the substrate 101 in the third embodiment. As seen from FIG. 11, the compressive stress of the $Ti_xN$ film 108c decreases with the rising temperature of the substrate 101. The compressive stress of the $Ti_xN$ film 108c decreases monotonously from approximately $11.0\times10^{19}$ dyne/cm$^2$ at 50° C. to $0.5\times10^{19}$ dyne/cm$^2$ at 450° C. The compressive stress is $3.0\times10^{19}$ dyne/cm$^2$ at 400° C.

The reason why the $Ti_xN$ film 108c has a low compressive stress is considered as follows.

Due to the high temperature of the substrate 101, the binding energy of the $Ti_xN$ film 108c becomes low. The low binding energy leads to a low density and a lot of voids and thus, the $Ti_xN$ film 108c has a low stress and a high etch rate.

Subsequently, the substrate 101 on which the Ti and $Ti_xN$ films 107 and 108c have been deposited is subjected to a first heat-treatment process in an Ar atmosphere in the same way as the first embodiment, thereby forming $TiSi_2$ layers 109 with the C-49 phase, as shown in FIG. 10B.

The whole $Ti_xN$ film 108c and the unreacted $Ti_xN$ film 107' are removed by a same wet etching process as in the first embodiment, thereby leaving the $TiSi_2$ layers 109 in the surface regions of the source/drain regions 106 and the gate electrode 104, respectively.

Finally, the substrate 101 on which the $SiN_x$ layers 109 have been formed is subjected to a second heat-treatment process in an Ar atmosphere in the same way as in the first embodiment. Thus, the $TiSi_2$ layers 109 with the C-49 phase are turned to $TiSi_2$ layers 111 with the C54-phase.

It is obvious that the method according to the third embodiment has the same advantages as those in the first embodiment.

There is the same additional advantage as in the second embodiment that the maximum performance of a sputtering apparatus is able to be utilized and that the necessary sputtering period is shorter (i.e., the sputtering rate is higher) than the method according to the first embodiment.

Although Ti is used as the refractory metal in the first to third embodiments, the present invention is not limited to Ti. It is needless to say that any other refractory metal such as tungsten (W) or cobalt (Co) may be use in the present invention.

Although the refractory-metal silicide layers 111 are used for a MOSFET in the first to third embodiments, the present invention is not limited thereto. The present invention may be applied to a bipolar transistor.

While the preferred examples of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device, comprising the steps of:
   (a) forming a first refractory metal film on a silicon region;
   (b) forming a second refractory metal film on said first refractory metal film;
   said second refractory metal film containing a same refractory metal as said first refractory metal film and nitrogen;
   a stress of said second refractory metal film being controlled to be a specific value or lower; and
   (c) heat-treating said the first refractory metal film and said second refractory metal film in an atmosphere excluding nitrogen, thereby forming a refractory-metal silicide layer at an interface between said silicon region and said first refractory metal film due to silicidation reaction of said first refractory metal film with said silicon region;
   wherein the value of said stress of said second refractory metal film is set so that said second refractory metal film applies substantially no effect to a plastic deformation of said refractory-metal silicide layer occurring during said silicidation reaction in the step (c).

2. The method as claimed in claim 1, wherein the specific value of said stress of said second refractory metal film is $3\times10^9$ dyne/cm$^2$.

3. The method as claimed in claim 1, wherein said first refractory metal film is transformed to a third refractory metal film due to diffusion of said nitrogen contained in said second refractory metal film into said first refractory metal film in the step (c);
   and wherein said third refractory metal film contains a same refractory metal as said first refractory metal film and nitrogen.

4. The method as claimed in claim 3, further comprising the steps of:
   (d) selectively removing said first refractory metal film and said unreacted third refractory metal film to expose said refractory-metal silicide layer;
   said refractory-metal silicide layer having a first phase; and
   (e) heat-treating said refractory-metal silicide layer to have a second phase due to phase transition.

5. The method as claimed in claim 1, wherein the step (b) of forming said second refractory metal film is carried out by a reactive sputtering process in an atmosphere including a same refractory metal as said first refractory metal film and nitrogen at a power density of 2.5 W/cm$^2$ or lower.

6. The method as claimed in claim 1, wherein the step (b) of forming said second refractory metal film is carried out by a reactive sputtering process in an atmosphere including a same refractory metal as said first refractory metal film and nitrogen at a pressure of 8 mTorr or higher.

7. The method as claimed in claim 1, wherein the step (b) of forming said second refractory metal film is carried out by a reactive sputtering process in an atmosphere including a same refractory metal as said first refractory metal film and nitrogen under a condition that said silicon region is kept at a temperature of 400° C. or higher.

8. The method as claimed in claim 1, wherein said nitrogen-excluding atmosphere in the step (c) of heat-treating said first and second refractory metal films is an inert atmosphere or vacuum atmosphere.

9. The method as claimed in claim 1, wherein said first refractory metal film is a titanium film.

10. The method as claimed in claim 1, wherein said first refractory metal film is a titanium film and said second refractory metal film is a titanium nitride film.

11. A fabrication method of a semiconductor device comprising the steps of:

(a) selectively forming an isolation insulator on a surface of a silicon substrate, thereby defining a device region;

(b) forming a gate insulator on the surface of said substrate in said device region;

(c) forming a gate electrode on said gate insulator;

(d) forming insulating sidewall spacers on the surface of said substrate at each side of said gate electrode;

said sidewall spacers being contacted with corresponding side faces of said gate electrode;

(e) forming source/drain regions in said substrate at each side of said gate electrode by introducing an impurity into said device region of said substrate;

(f) forming a first refractory metal film in contacted with said isolation insulator, said insulating sidewall spacers, and said source/drain regions;

(g) forming a second refractory metal film on said first refractory metal film;

said second refractory metal film containing a same refractory metal as said first refractory metal film and nitrogen;

a stress of said second refractory metal film being controlled to be a specific value or lower; and (h) heat-treating said first refractory metal film and said second refractory metal film in an atmosphere excluding nitrogen, thereby forming a refractory-metal silicide layer at an interface of said first refractory metal film with said source/drain regions;

wherein the value of said stress of said second refractory metal film is set so that said second refractory metal film applies substantially no effect to a plastic deformation of said refractory-metal silicide layer occurring during said silicidation reaction in the step (c).

12. The method as claimed in claim 11, wherein the specific value of said stress of said second refractory metal film is $3 \times 10^9$ dyne/cm$^2$.

13. The method as claimed in claim 11, wherein said first refractory metal film is transformed to a third refractory metal film due to diffusion of said nitrogen contained in said second refractory metal film into said first refractory metal film in the step (h);

and wherein said third refractory metal film contains a same refractory metal as said first refractory metal film and nitrogen.

14. The method as claimed in claim 11, further comprising the steps of:

(i) selectively removing said first refractory metal film and said unreacted third refractory metal film to expose said refractory-metal silicide layer;

said refractory-metal silicide layer having a first phase; and (j) heat-treating said refractory-metal silicide layer to have a second phase due to phase transition.

15. The method as claimed in claim 11, wherein the step (g) of forming said second refractory metal film is carried out by a reactive sputtering process in an atmosphere including a same refractory metal as said first refractory metal film and nitrogen at a power density of 2.5 W/cm$^2$ or lower.

16. The method as claimed in claim 11, wherein the step (g) of forming said second refractory metal film is carried out by a reactive sputtering process in an atmosphere including a same refractory metal as said first refractory metal film and nitrogen at a pressure of 8 mTorr or higher.

17. The method as claimed in claim 11, wherein the step (g) of forming said second refractory metal film is carried out by a reactive sputtering process in an atmosphere including a same refractory metal as said first refractory metal film and nitrogen under a condition that said silicon region is kept at a temperature of 400° C. or higher.

18. The method as claimed in claim 11, wherein said nitrogen-excluding atmosphere in the step (h) of heat-treating said first and second refractory metal films is an inert atmosphere or vacuum atmosphere.

19. The method as claimed in claim 11, wherein said first refractory metal film is a titanium film.

20. The method as claimed in claim 11, wherein said first refractory metal film is a titanium film and said second refractory metal film is a titanium nitride film.

* * * * *